United States Patent
Chen et al.

(10) Patent No.: US 12,119,851 B2
(45) Date of Patent: *Oct. 15, 2024

(54) FEED FORWARD ECHO CANCELLATION DEVICE AND ECHO CANCELLATION METHOD

(71) Applicant: REALTEK SEMICONDUCTOR CORPORATION, Hsinchu (TW)

(72) Inventors: Chien-Wen Chen, Hsinchu (TW); Yi-Ching Liao, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 18 days.

This patent is subject to a terminal disclaimer.

(21) Appl. No.: 17/861,378

(22) Filed: Jul. 11, 2022

(65) Prior Publication Data

US 2023/0110555 A1 Apr. 13, 2023

(30) Foreign Application Priority Data

Oct. 7, 2021 (TW) .................................. 110137290

(51) Int. Cl.
*H04B 1/04* (2006.01)
*H03G 3/30* (2006.01)

(52) U.S. Cl.
CPC ......... *H04B 1/0475* (2013.01); *H03G 3/3036* (2013.01); *H03G 2201/103* (2013.01); *H04B 2001/0416* (2013.01)

(58) Field of Classification Search
CPC .......... H04B 1/0475; H04B 2001/0146; H03G 3/3036; H03G 2201/103

(Continued)

(56) References Cited

U.S. PATENT DOCUMENTS 6,304,598 B1 * 10/2001 Agazzi .................. H04B 3/487
375/232
6,731,160 B1 * 5/2004 Behzad ................ H03G 3/3036
327/552

(Continued)

FOREIGN PATENT DOCUMENTS

TW 200527830 8/2005
TW 200533092 10/2005

(Continued)

OTHER PUBLICATIONS

OA letter of a counterpart TW application (appl. No. 110137290) mailed on Jun. 28, 2022. Summary of the TW OA letter: 1. Claims 1-2 and 4-8 are rejected as allegedly being unpatentable over cited reference 1 (TW I623192B, also published as U.S. Pat. No. 9,385,661B1) in view of cited reference 2 (TW 200805878A, also published as U.S. Pat. No. 20080012634 A1). 2. Claims 3 and 9-10 are allowable. Correspondence between claims of TW counterpart application and claims of US application: 1. Claims 1-10 in TW counterpart application correspond to claims 1-10 in US application, respectively.

*Primary Examiner* — Kevin M Burd
(74) *Attorney, Agent, or Firm* — WPAT, P.C.

(57) ABSTRACT

A feed forward echo cancellation device includes a first impedance circuit, a second impedance circuit, and an echo cancellation current generator circuit. The first impedance circuit is configured to output a first current to a node in response to a transmission current. The second impedance circuit is configured to output a second current to a node in response to the transmission current. The echo cancellation current generator circuit is configured to drain an echo cancellation current from the node. The node is connected to an input terminal of a programmable gain amplifier circuit via a gain control circuit, and the gain control circuit is (Continued)

configured to set a gain of the programmable gain amplifier circuit.

16 Claims, 4 Drawing Sheets

(58) Field of Classification Search
USPC .......................................................... 375/297
See application file for complete search history.

(56) References Cited

U.S. PATENT DOCUMENTS

| | | |
|---|---|---|
| 9,385,661 B1 | 7/2016 | Lin |
| 11,671,124 B2* | 6/2023 | Chen .................... H03G 3/3052 375/297 |
| 2005/0185603 A1 | 8/2005 | Huang |
| 2005/0232170 A1* | 10/2005 | Chiu ..................... H04L 5/1461 370/276 |
| 2006/0280234 A1* | 12/2006 | Gupta ..................... H04B 3/23 375/219 |
| 2008/0012634 A1 | 1/2008 | Oyang |
| 2020/0091868 A1* | 3/2020 | Delshadpour .......... H03K 5/249 |

FOREIGN PATENT DOCUMENTS

| | | |
|---|---|---|
| TW | 200805878 A | 1/2008 |
| TW | I623192 B | 5/2018 |

* cited by examiner

FEED FORWARD ECHO CANCELLATION DEVICE AND ECHO CANCELLATION METHOD

BACKGROUND OF THE INVENTION

1. Field of the Invention

The present disclosure relates to an echo cancellation device, especially to a feed forward echo cancellation device that is applied to an Ethernet network device, and an echo cancellation method thereof.

2. Description of Related Art

In a full duplex communication system, a communication device can simultaneously transmit and receive signals. Therefore, the signal received by a receiver in a communication device may include an echo generated based on a data signal outputted from a local transmitter and a data signal from another communication device. In order to correctly obtain data signals from another communication device, an echo cancellation device can be implemented to reduce the impact of echoes. In some related approaches, a mismatch may exist between a compensation signal generated by the echo cancellation device and the echo in high frequency bands, such that the compensation signal cannot effectively reduce the impact of the echo. On the other hand, in those approaches, the echo cancellation device eliminates echoes by summing up the compensation signal and the signal outputted from a programmable gain amplifier in the communication device. However, when the communication device adjusts the gain of the programmable gain amplifier according to the operating state, the echo cancellation device is not adjusted accordingly, such that the compensation signal may not be able to effectively reduce the impacts of the echo.

SUMMARY OF THE INVENTION

In some aspects of the present disclosure, a feed forward echo cancellation device includes a first impedance circuit, a second impedance circuit, and an echo cancellation current generator circuit. The first impedance circuit is configured to output a first current to a node in response to a transmission current. The second impedance circuit is configured to output a second current to the node in response to the transmission current. The echo cancellation current generator circuit is configured to drain an echo cancellation current from the node, in which the node is connected to an input terminal of a programmable gain amplifier circuit via a gain control circuit, and the gain control circuit is configured to set a gain of the programmable gain amplifier circuit.

In some aspects of the present disclosure, an echo cancellation method includes the following operations: outputting a first current to a node in response to a transmission current, wherein the node is connected to an input terminal of a programmable gain amplifier circuit via a gain control circuit, and the gain control circuit is configured to set a gain of the programmable gain amplifier circuit; draining an echo cancellation current from the node; and outputting a second current to the node in response to the transmission current, in which a summation of the first current and the second current is approximate to the echo cancellation current.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

As used herein, "substantially", "approximate to" or "equal to" shall generally mean within 20 percent, preferably within 10 percent, and more preferably within 5 percent of a given value or range. Numerical quantities given herein are approximate, meaning that the term "substantially", "approximate to" or "equal to" can be inferred if not expressly stated.

Figure 1:
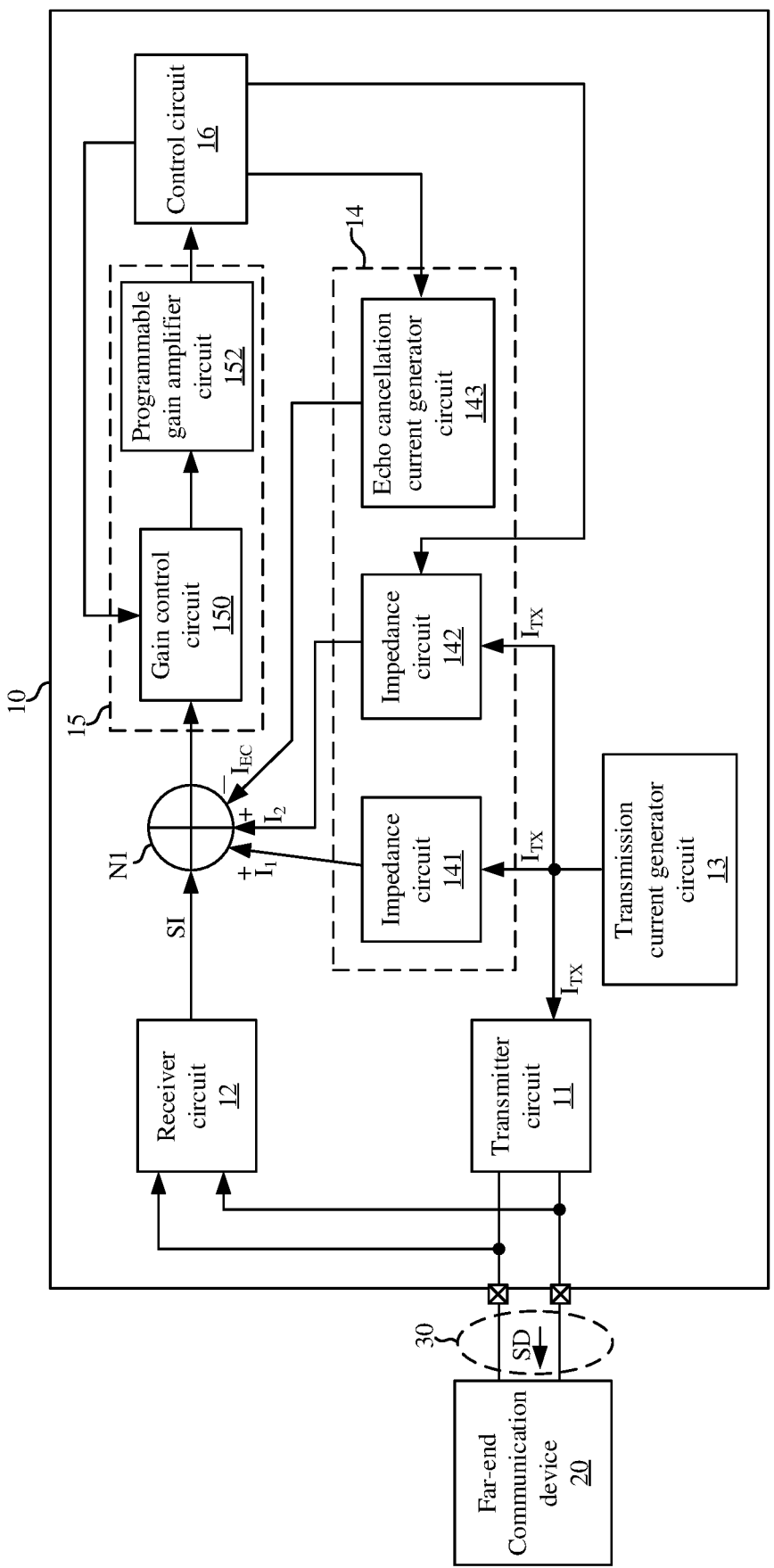
FIG. 1 shows a schematic diagram of a near end communication device according to some embodiments of the present disclosure.

FIG. 1 shows a schematic diagram of a near end communication device 10 according to some embodiments of the present disclosure. In some embodiments, the near end communication device 10 may be, but not limited to, an Ethernet network device. For example, the near end communication device 10 may be a part device in the Ethernet interface controller. The near end communication device 10 may include a transmitter circuit 11, a receiver circuit 12, a transmission current generator circuit 13, a feed forward echo cancellation device 14, an amplifier 15, and a control circuit 16.

The transmitter circuit 11 is configured to transmit a data signal SD to a far end communication device 20 via a cable 30. The transmission current generator circuit 13 is configured to generate a transmission current $I_{TX}$. In some embodiments, the transmission current generator circuit 13 may be, but not limited to, a current digital to analog converter circuit, which is configured to convert information transmitted from the near end communication device 10 into the transmission current $I_{TX}$. As a result, the transmitter circuit 11 may generate a data signal SD according to the transmission current $I_{TX}$. The receiver circuit 12 may receive a data signal from the far end communication device 20 via the cable 30. During a progress of receiving signals, the receiver circuit 12 may receive the data signal SD generated from the transmitter circuit 11, which makes the near end communication device 10 be affected by echo and produce nonlinear distortion. The feed forward echo cancellation device 14 may be configured to generate currents (e.g., the current $I_2$ and the echo cancellation current $I_{EC}$ as discussed below), in order to reduced impacts from echo.

In greater detail, the feed forward echo cancellation device 14 includes an impedance circuit 141, an impedance circuit 142, and an echo cancellation current generator circuit 143. The impedance circuit 141 may provide an impedance (e.g., resistor R1 in FIG. 3), and the resistance value of the impedance makes an equivalent input impedance be equal to (or approximate to) an impedance of a path for the near end communication device 10 transmitting signals to the far end communication device 20. The impedance circuit 141 generates a current $I_1$ to a node N1 (labeled with "plus") in response to the transmission current $I_Tx$. In other words, by utilizing the impedance circuit 141, the current $I_1$ is generated to simulate the echo received by the receiver circuit 12. The impedance circuit 142 generates a current $I_2$ to the node N1 (labeled with "plus") in response to the transmission current $I_Tx$. The echo cancellation current generator circuit 143 is configured to drain the echo cancellation current $I_{EC}$ from the node N1 (labeled as "minus"). In some embodiments, the echo cancellation current generator circuit 143 may operate as a current source circuit, which is coupled between the node N1 and ground to drain the echo cancellation current $I_{EC}$ from the node N1. In some embodiments, the echo cancellation current generator circuit 143 may be a current digital to analog converter circuit, which is controlled by the control circuit 16 to set the echo cancellation current $I_{EC}$ or a ratio of transmission current $I_{TX}$.

Furthermore, as shown in FIG. 1, data received by the receiver circuit 12 (labeled as the data signal SI) is transmitted to the amplifier 15 via the node N1. As a result, the amplifier 15 may amplify the data signal SI, in order to provide the amplified signal to subsequent circuit(s) (which may be, for example, the control circuit 16) for subsequent data processing. The data signal SI, the current $I_1$, the current $I_2$ and the echo cancellation current $I_{EC}$ are summed up at the node N1 and then are transmitted to the amplifier 15. Accordingly, if a summation of the current $I_1$, the current $I_2$, and the echo cancellation current $I_{EC}$ is equal to (or approximate to) 0, the current $I_1$, the current $I_2$, and the echo cancellation current $I_{EC}$ are cancelled with each other at the node N1, such that the amplifier 15 receives the data signal SI that is less affected by echoes. As a result, the amplifier 15 is able to generate more accurate data signal. In other words, as the current $I_1$ is substantially equals to the echo, if the summation of the current $I_1$, the current $I_2$, and the echo cancellation current $I_{EC}$ is equal to (or approximate to) 0, it indicates that the echo can be canceled (or reduced), such that the near end communication device 10 is able to read the received data more accurately. Regarding the corresponding relation among the current $I_1$, the current $I_2$, and the echo cancellation current $I_{EC}$ will be described with reference to FIG. 2.

The amplifier 15 includes a gain control circuit 150 and a programmable gain amplifier circuit 152. The gain control circuit 150 may set a gain of the programmable gain amplifier circuit 152 according to the control of the control circuit 16. In some embodiments, the gain control circuit 150 may be an AC coupling circuit, but the present disclosure is not limited thereto. In some embodiments, the gain control circuit 150 may be part of the feedback network in the programmable gain amplifier circuit 152. The node N1 is connected to the programmable gain amplifier circuit 152 via the gain control circuit 150. The control circuit 16 analyzes a system convergence indicator according to output signal(s) of the programmable gain amplifier circuit 152, in order to determine whether to adjust the gain control circuit 150 to set the gain of the programmable gain amplifier circuit 152. In some embodiments, the system convergence indicator may include, but not limited to, the power of the echo, a signal-to-noise ratio, and so on.

In some embodiments, the control circuit 16 may include, but not limited to, an analog to digital convertor (not shown in FIG. 1) and a digital signal processor circuit (not shown in FIG. 1). The analog to digital converter circuit may converter the output signal of the programmable gain amplifier circuit 152 to be digital data, and the digital signal processor circuit may perform a specific algorithm according to the digital data to determine the system convergence indicator.

As shown in FIG. 1, the impedance circuit 141, the impedance circuit 142, and the echo cancellation current generator circuit 143 cancel the echo at the node N1 that is connected to an input terminal of the amplifier 15. In other words, the impedance circuit 141, the impedance circuit 142, and the echo cancellation current generator circuit 143 may share the gain control circuit 150 and the programmable gain amplifier circuit 152. Under this condition, when the control circuit 16 adjusts the gain of the amplifier 15 according to the current operating state, the frequency response of each of the impedance circuit 141, the impedance circuit 142, and the echo cancellation current generator circuit 143 can be adjusted together. As a result, the current $I_1$, the current $I_2$, and the echo cancellation current $I_{EC}$ can be adjusted accordingly to achieve a better echo cancellation.

Figure 2:
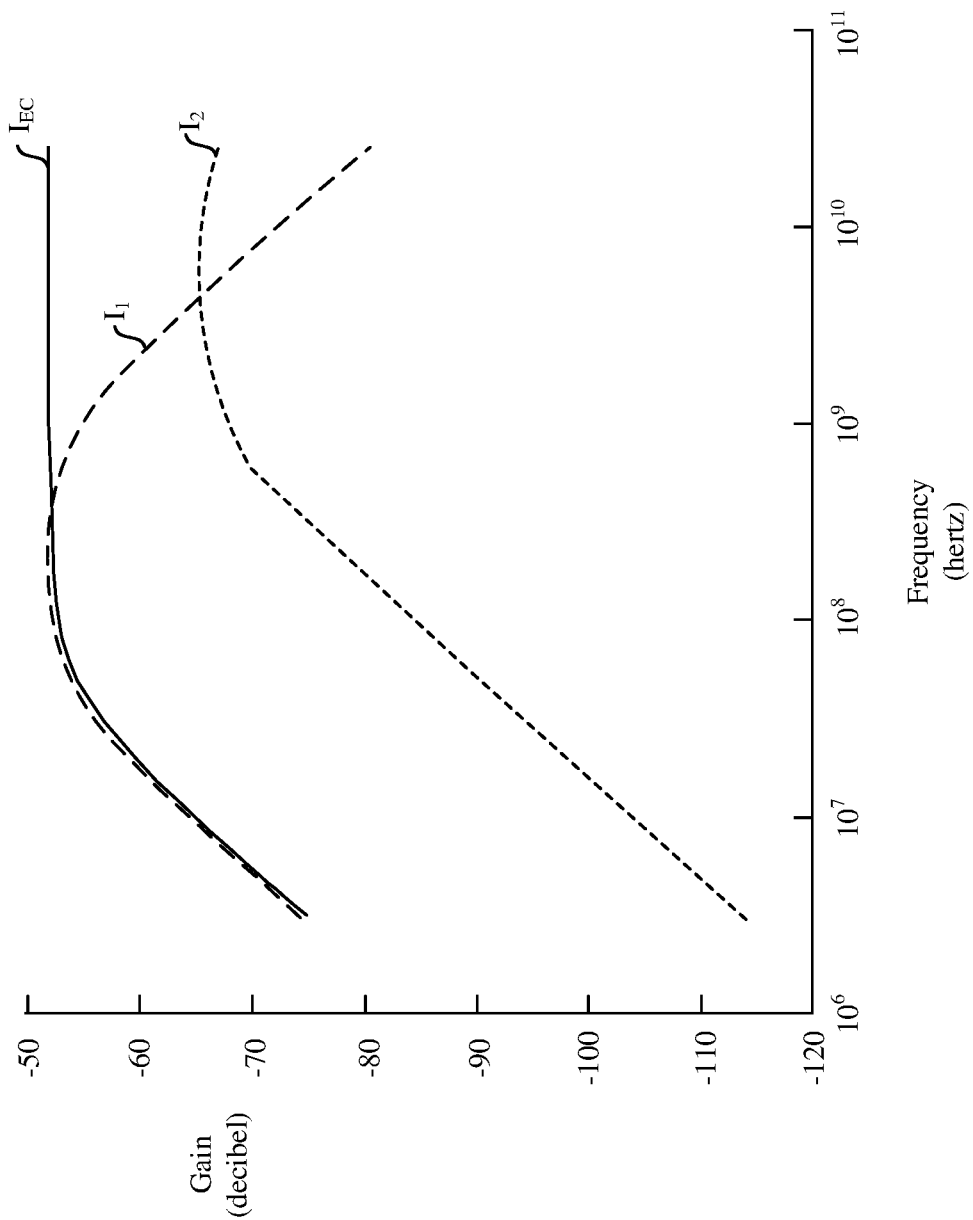
FIG. 2 shows a schematic diagram of the frequency responses of the first current, the second current, and the echo cancellation current in FIG. 1 according to some embodiments of the present disclosure.

FIG. 2 shows a schematic diagram of the frequency responses of the current $I_1$, the current $I_2$, and the echo cancellation current $I_{EC}$ in FIG. 1 according to some embodiments of the present disclosure. In some embodiments, a current outputted from the gain control circuit 150 (hereinafter referred to as "current IPGA") can be divided by a corresponding current can be divided to calculate the gain, in order to obtain the frequency response of that corresponding current. For example, the gain of the current $I_1$ may be expressed as $IPGA/I_1$, the gain of the current $I_2$ may be expressed as $IPGA/I_2$, and the gain of the current $I_{EC}$ may be expressed as $IPGA/I_{EC}$.

As mentioned above, the current $I_1$ may be considered as echo. The echo cancellation current $I_{EC}$ may be employed to cancel the current $I_1$ at the node N1, in order to reduce the impacts from echo. Ideally, the echo cancellation current $I_{EC}$ should be equal to or approximate to the current $I_1$. However, as the practical impedances of the transmission paths may be different, a mismatch between the current $I_1$ and the echo cancellation current $I_{EC}$ exists in high frequency bands, which causes the echo cancellation current $I_{EC}$ to be not equal to or not approximate to the current $I_1$. The impedance circuit 142 is able to provide the current $I_2$ to the node N1, in order to compensate the energy mismatch in high frequency bands. That is, the summation of the current $I_1$ and the current $I_2$ may be substantially approximate to or equal to the echo cancellation current $I_{EC}$ (which may be expressed as: $I_1+I_2 \approx I_{EC}$).

Figure 3:
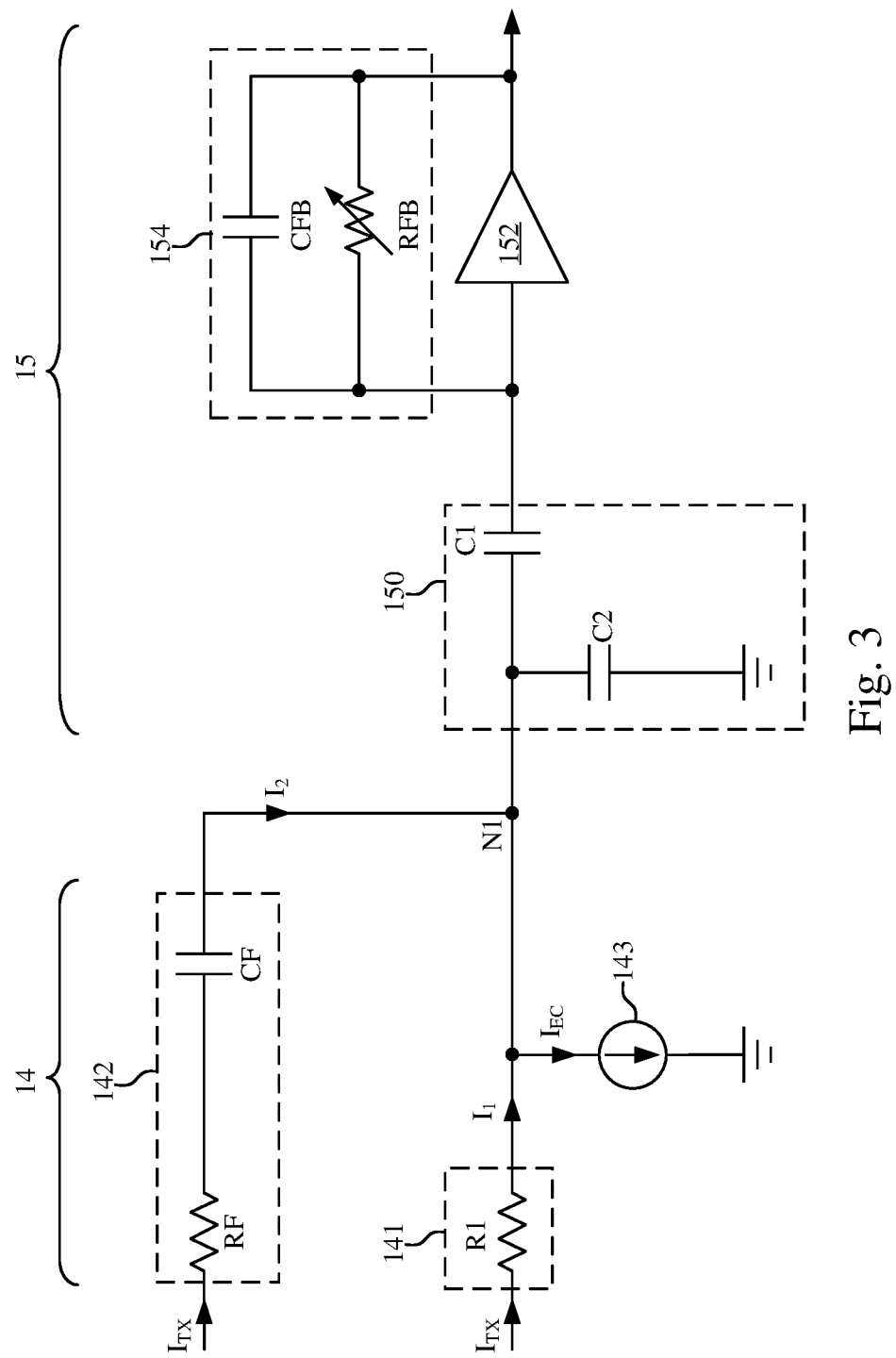
FIG. 3 shows a schematic diagram of the feed forward echo cancellation device and the amplifier in FIG. 1 according to some embodiments of the present disclosure.

FIG. 3 shows a schematic diagram of the feed forward echo cancellation device 14 and the amplifier 15 in FIG. 1 according to some embodiments of the present disclosure. In this example, the impedance circuit 141 includes a resistor R1, which may output the transmission current $I_{TX}$ to be the current $I_1$. A terminal of the resistor R1 and the echo cancellation current generator circuit 143 are coupled to the node N1, and the echo cancellation current generator circuit 143 is coupled between the node N1 and ground. As a result, the echo cancellation current generator circuit 143 may drain the echo cancellation current $I_{EC}$ from the node N1. The impedance circuit 142 may include a resistor RF and a capacitor CF. The resistor RF and the capacitor CF form a high-pass signal path, in order to generate the current $I_2$ in response to the transmission current $I_{TX}$. In some embodiments, the capacitor CF may be a capacitive network or a capacitor array network, which may control the capacitance value of the capacitor CF according to the control of the control circuit 16. In some embodiments, the resistor RF and the capacitor CF may be configured to set the bandwidth of the high-pass signal path. For example, the product of values of the resistor RF and the capacitor CF may determine a corner frequency of the current $I_2$ in FIG. 2.

In this example, the impedance circuit 141 may be directly coupled to the node N1, in order to transmit the current $I_1$ to the node N1. The impedance circuit 142 may be directly coupled to the node N1, in order to transmit the current $I_2$ to the node N1. Similarly, the echo cancellation current generator circuit 143 may be directly coupled to the node N1, in order to drain the echo cancellation current $I_{EC}$ from the node N1 to ground. In other words, the current $I_1$, the current $I_2$, and the echo cancellation current $I_{EC}$ can be summed up at the node N1. As shown in FIG. 1, the current $I_1$ and the current $I_2$ flow into the node N1, and the echo cancellation current $I_{EC}$ flows out the node N1. Under this condition, the summation of the current $I_1$, the current $I_2$, and the echo cancellation current $I_{EC}$ can be expressed as: $I_1+I_2-I_{EC} \approx 0$.

Moreover, the node N1 is further connected to the input terminal of the programmable gain amplifier circuit 152 via the gain control circuit 150. The gain control circuit 150 may be, for example but not limited to, an AC coupling circuit (which may be a DC coupling circuit in some other embodiments), which includes a capacitor C1 and a capacitor C2. The capacitor C1 is coupled between the node N1 and the input terminal of the programmable gain amplifier circuit 152. The capacitor C2 is coupled between the node N1 and ground. In some embodiments, each of the capacitor C1 and the capacitor C2 may be a switched-capacitor circuit or a capacitive network. The equivalent capacitance value of the gain control circuit 150 may be determined with the capacitor C1 and the capacitor C2. As mentioned above, the data signal SI may be transmitted to the programmable gain amplifier circuit 152 via the node N1 and the gain control circuit 150. Therefore, if the capacitance value of the capacitor C1 is higher, the corresponding AC impedance is lower, which increases the power or energy of the data signal SI being transmitted to the programmable gain amplifier circuit 152 via the gain control circuit 150. As a result, the gain of the programmable gain amplifier circuit 152 is increased. Alternatively, if the capacitance value of the capacitor C1 is lower, the corresponding AC impedance is higher, which reduces the power or energy of the data signal SI being transmitted to the programmable gain amplifier circuit 152 via the gain control circuit 150. As a result, the gain of the programmable gain amplifier circuit 152 is lower.

In some embodiments, the amplifier 15 further include a feedback network, which may adjust the gain and/or the frequency response of the programmable gain amplifier circuit 152. For example, the amplifier 15 includes a feedback network 154, which is coupled between the input terminal and the output terminal of the programmable gain amplifier circuit 152. The feedback network 154 includes a variable resistor RFB and a capacitor CFB. The variable resistor RFB may adjust its resistance value based on the control of the control circuit 16, in order to cooperate with the gain control circuit 150 to set the gain of the programmable gain amplifier circuit 152 or to set the frequency response of the programmable gain amplifier circuit 152.

The arrangements of FIG. 3 are given for illustrative purposes, and the present disclosure is not limited thereto. Various arrangements able to share the same gain control circuit and the feed forward echo cancellation mechanism of the programmable gain amplifier circuit are within the contemplated scope of the present disclosure.

Figure 4:
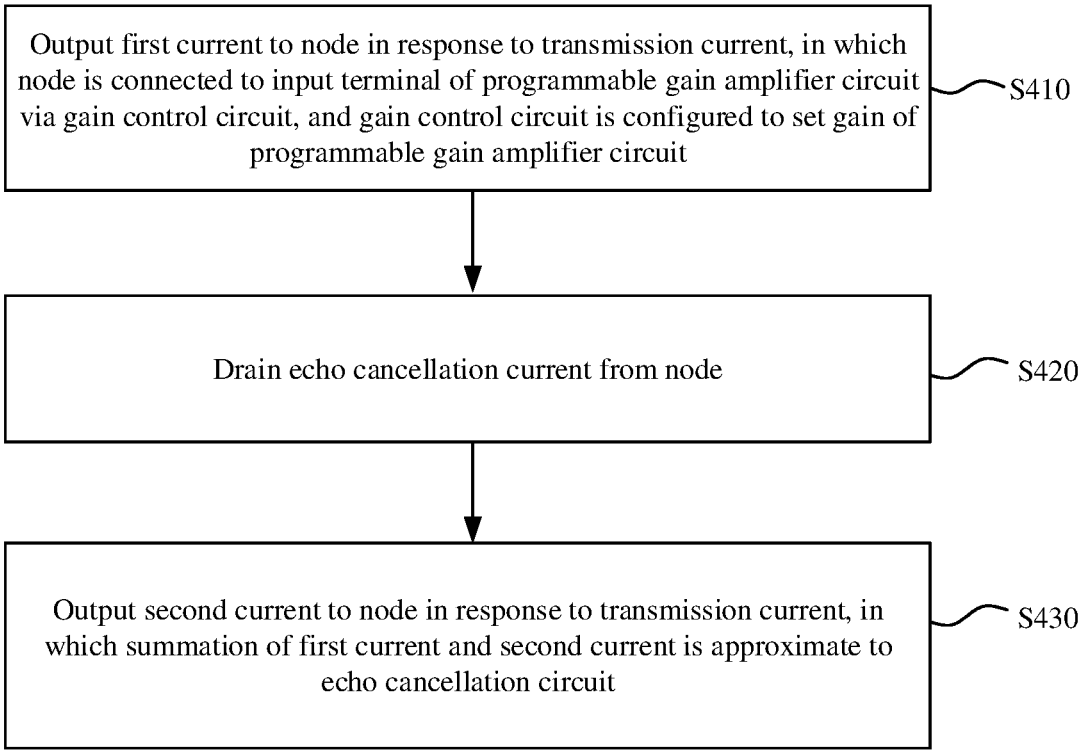
FIG. 4 shows a flow chart of an echo cancellation method according to some embodiments of the present disclosure.

FIG. 4 shows a flow chart of an echo cancellation method 400 according to some embodiments of the present disclosure. In some embodiments, operations in FIG. 4 may be, but not limited to, performed by the feed forward echo cancellation device 14 in FIG. 1.

In operation 5410, a first current (e.g., the current $I_1$) is outputted to a node (e.g., the node N1) in response to a transmission current (e.g., the transmission current $I_{TX}$), in which the node is connected to an input terminal of a programmable gain amplifier circuit (e.g., the programmable gain amplifier circuit 152) via a gain control circuit (e.g., the gain control circuit 150), and the gain control circuit is configured to set the gain of the programmable gain amplifier circuit.

In operation 5420, an echo cancellation current (e.g., the current $I_{EC}$) is drained from the node.

In operation 5430, a second current (e.g., the current $I_2$) is outputted to the node in response to the transmission current, in which a summation of the first current and the second current is approximate to the echo cancellation current.

The above operations can be understood with reference to the above various embodiments, and thus the repetitious descriptions are not further given. The above description of the echo cancellation method 400 includes exemplary operations, but the operations of the echo cancellation method 400 are not necessarily performed in the order described above. Operations of the echo cancellation method 400 can be added, replaced, changed order, and/or eliminated, or the operations of the echo cancellation method 400 can be executed simultaneously or partially simultaneously as appropriate, in accordance with the spirit and scope of various embodiments of the present disclosure.

As described above, the feed forward echo cancellation device and the echo cancellation method in some embodiments of the present disclosure may be adjusted automatically during the communication device adjusts its circuit configuration according to the current operating sate, in order to achieve a better echo cancellation.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A feed forward echo cancellation device, comprising:
    a first impedance circuit configured to output a first current to a node in response to a transmission current;
    a second impedance circuit configured to output a second current to the node in response to the transmission current; and
    an echo cancellation current generator circuit configured to drain an echo cancellation current from the node,
    wherein the node is connected to an input terminal of a programmable gain amplifier circuit via a gain control circuit, the gain control circuit is configured to set a gain of the programmable gain amplifier circuit, and a bandwidth of the second impedance circuit is controlled based on an output of the programmable gain amplifier circuit.

2. The feed forward echo cancellation device of claim 1, wherein the first current, the second current, and the echo cancellation current are canceled with each other at the node.

3. The feed forward echo cancellation device of claim 1, wherein a summation of the first current and the second current is equal to the echo cancellation current.

4. The feed forward echo cancellation device of claim 1, wherein the first impedance circuit, the second impedance circuit, and the echo cancellation current generator circuit-are directly coupled to the node.

5. The feed forward echo cancellation device of claim 1, wherein the gain control circuit is an AC coupling circuit or a DC coupling circuit.

6. The feed forward echo cancellation device of claim 1, wherein the second impedance circuit comprises a resistor and a capacitor, and the resistor and the capacitor are configured to set a corner frequency of the second current.

7. The feed forward echo cancellation device of claim 1, wherein the echo cancellation current generator circuit is a current digital to analog converter circuit.

8. The feed forward echo cancellation device of claim 1, wherein the gain control circuit is adjusted based on a system convergence indicator, in order to set the gain or a ratio of the transmission current.

9. The feed forward echo cancellation device of claim 1, wherein the node is further configured to receive a data signal, and transmit the data signal to the programable gain amplifier circuit.

10. The feed forward echo cancellation device of claim 1, wherein a transmitter of a near end communication device transmits a signal to a far end communication device via a path according to the transmission current, and the first impedance circuit is configured to provide an impedance having a resistance value corresponding to an impedance of the path.

11. An echo cancellation method, comprising:
    outputting a first current to a node in response to a transmission current, wherein the node is connected to an input terminal of a programmable gain amplifier circuit via a gain control circuit, and the gain control circuit is configured to set a gain of the programmable gain amplifier circuit;
    draining an echo cancellation current from the node; and
    outputting a second current to the node in response to the transmission current, wherein a summation of the first current and the second current is approximate to the echo cancellation current, wherein the second current is outputted from a second impedance circuit, and a bandwidth of the second impedance circuit is controlled based on an output of the programmable gain amplifier circuit.

12. The echo cancellation method of claim 11, wherein the first current, the second current, and the echo cancellation current are canceled with each other at the node.

13. The echo cancellation method of claim 11, wherein a summation of the first current and the second current is equal to the echo cancellation current.

14. The echo cancellation method of claim 11, wherein the first current, the second current, and the echo cancellation current are directly transmitted to the node.

15. The echo cancellation method of claim 11, wherein the gain control circuit is an AC coupling circuit or a DC coupling circuit.

16. The echo cancellation method of claim 11, wherein the first current is outputted from a first impedance circuit, a transmitter of a near end communication device transmits a signal to a far end communication device via a path according to the transmission current, and the first impedance circuit is configured to provide an impedance having a resistance value corresponding to an impedance of the path.

* * * * *